US012692591B2

(12) United States Patent
Jang et al.

(10) Patent No.: US 12,692,591 B2
(45) Date of Patent: Jul. 28, 2026

(54) DEPOSITION APPARATUS

(71) Applicant: Samsung Display Co., LTD., Yongin-si (KR)

(72) Inventors: Ki Sun Jang, Yongin-si (KR); Kwan Yong Lee, Yongin-si (KR); Jong Ho Park, Yongin-si (KR); Hyung Keon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/980,581

(22) Filed: Dec. 13, 2024

(65) Prior Publication Data

US 2025/0313944 A1     Oct. 9, 2025

(30) Foreign Application Priority Data

Apr. 5, 2024     (KR) ........................ 10-2024-0046846

(51) Int. Cl.
*C23C 14/35*          (2006.01)
*H01F 7/02*          (2006.01)
*H01J 37/34*          (2006.01)

(52) U.S. Cl.
CPC ......... *C23C 14/351* (2013.01); *H01F 7/0294* (2013.01); *H01J 37/345* (2013.01); *H01J 37/3452* (2013.01); *H01J 37/3455* (2013.01)

(58) Field of Classification Search
CPC .. H01J 37/3455; H01J 37/3452; H01J 37/345; H01J 37/3405; H01J 37/347; C23C 14/351; C23C 14/35; C23C 14/3407; C23C 14/3405; C23C 14/352; C23C 14/3464; H01F 7/0294

USPC .......................................... 204/298.2, 298.19
See application file for complete search history.

(56) References Cited

U.S. PATENT DOCUMENTS 5,458,759 A * 10/1995 Hosokawa .............. C23C 14/35
                                                        204/298.23
11,646,180 B2     5/2023 Lee et al.
2008/0190765 A1* 8/2008 Lopp ................... H01J 37/3408
                                                        204/298.16

(Continued)

FOREIGN PATENT DOCUMENTS

JP          2016176125 A   * 10/2016
KR     10-2008-0009292          1/2008

(Continued)

OTHER PUBLICATIONS

Machine Translation JP-2016176125 (Year: 2016).*

*Primary Examiner* — Rodney G McDonald
(74) *Attorney, Agent, or Firm* — Sughrue Mion, PLLC

(57)          ABSTRACT

A deposition apparatus includes a chamber including an internal space where a deposition process takes place, and at least one magnet unit positioned below the chamber and including a first magnet member and a second magnet member, the second magnet member being positioned around an outer periphery of the first magnet member and spaced apart from the first magnet member, wherein the first magnet member includes a first magnet main body, which extends in a first direction, and a first magnet extension, which is positioned at at least one end of the first magnet main body and has a width greater than a width of the first magnet main body in a second direction intersecting the first direction, and the first magnet extension includes a penetration hole.

19 Claims, 27 Drawing Sheets

(56) References Cited

U.S. PATENT DOCUMENTS

2022/0148779 A1* 5/2022 Lee ........................ H01F 7/021

FOREIGN PATENT DOCUMENTS

| KR | 10-1165432 | 7/2012 |
| KR | 10-2020-0095513 | 8/2020 |
| KR | 10-2021-0016189 | 2/2021 |
| KR | 10-2022-0065163 | 5/2022 |

* cited by examiner

DEPOSITION APPARATUS

CROSS-REFERENCE TO RELATED APPLICATION(S)

This application claims priority to and benefits of Korean Patent Application No. 10-2024-0046846 under 35 U.S.C. 119, filed on Apr. 5, 2024, in the Korean Intellectual Property Office (KIPO), the entire contents of which are incorporated herein by reference.

BACKGROUND

1. Technical Field

The disclosure relates to a deposition apparatus.

2. Description of the Related Art

With the advancement of the information society, the demand for display devices to present images in various forms is increasing. Display devices have been applied to various electronic devices such as smartphones, digital cameras, laptop computers, navigation systems, and smart televisions.

As display devices, various types of display devices such as liquid crystal display (LCD) and organic light-emitting diode (OLED) display devices are used. OLED display devices, in particular, utilize organic light-emitting elements to produce light by recombination of electrons and holes. The OLED display devices include multiple transistors to supply current to the organic light-emitting elements.

In the manufacturing process of display devices, thin-film transistor (TFT) fabrication can employ sputtering or plasma enhanced chemical vapor deposition (PECVD) depending on the deposition material. Sputtering, which involves bombarding a deposition material with ions in a vacuum to deposit atoms ejected from the deposition material on glass, is primarily used for metal materials. PECVD, which utilizes high-frequency power to create a potential difference between electrodes in a chamber, decomposing gas containing the deposition material into plasma, and depositing the deposition material onto the substrate, is used for semiconductors or insulating films.

For example, TFTs used in display devices are produced using a magnetron sputtering method that utilizes magnetic fields to enhance decomposition rates. This method enables the formation of thin films with desired patterns on the display device's substrate.

Nonetheless, during sputtering, certain areas of a deposition target may experience excessive consumption compared to others, resulting in uneven depletion. Consequently, productivity may be compromised as the deposition target may require premature replacement due to localized overconsumption, despite an adequate overall target supply.

SUMMARY

Aspects of the disclosure provide a deposition apparatus capable of ensuring uniform and stable deposition processes by preventing localized overconsumption of a deposition target.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a deposition apparatus may include a chamber including an internal space where a deposition process takes place; and at least one magnet unit positioned below the chamber and including a first magnet member and a second magnet member, the second magnet member being positioned around an outer periphery of the first magnet member and spaced apart from the first magnet member. The first magnet member may include a first magnet main body, which extends in a first direction, and a first magnet extension, which is positioned at at least one end of the first magnet main body and has a width greater than a width of the first magnet main body in a second direction intersecting the first direction, and the first magnet extension may include a penetration hole.

The penetration hole may penetrate the first magnet extension in a third direction perpendicularly intersecting the first and second directions.

A width, in the second direction, of the penetration hole may be smaller than the width, in the second direction, of the first magnet main body.

The width, in the second direction, of the first magnet main body may be about 1.1 to about 4.2 times the width, in the second direction, of the penetration hole.

The first magnet extension may include a first portion, which is positioned on a side, in the second direction, of the penetration hole, and a second portion, which is positioned on another side, in the second direction, of the penetration hole, and a width of the first portion and a width of the second portion, in the second direction, may each be smaller than the width, in the second direction, of the first magnet main body.

A sum of the width of the first portion and the width of the second portion, in the second direction, both lying on a virtual straight line extending along the second direction, may be greater than the width, in the second direction, of the first magnet main body.

The width, in the second direction, of the first magnet extension may be greater than a width, in the first direction, of the first magnet extension.

The width, in the second direction, of the first magnet extension may be about 1.5 to about 2.9 times the width, in the second direction, of the first magnet main body.

The second magnet member may include a second magnet main body, which is arranged in parallel to the first magnet main body, and second magnet end portions, which are positioned at both ends of the second magnet main body and face the first magnet extension, a width, in the second direction, of the second magnet main body may be smaller than the width, in the second direction, of the first magnet main body, and the second magnet end portion may include an inclined portion, which is inclined with respect to the first direction.

The width of the first magnet main body in the second direction may be in a range of about 19 mm to about 29 mm, the width of the first magnet extension in the second direction may be in a range of about 45 mm to about 55 mm, and a width of the first magnet extension in the first direction may be in a range of about 25 mm to about 35 mm.

The first magnet extension may have a polygonal, circular, or elliptical planar shape in a plan view.

A width of the penetration hole in the second direction may be in a range of about 7 mm to about 17 mm.

The penetration hole may have a triangular, rectangular, square, circular, or elliptical planar shape in a plan view.

The second magnet member may include a second magnet main body, which is arranged in parallel to the first magnet main body, and a width, in the second direction, of the second magnet main body may be smaller than the width, in the second direction, of the first magnet main body and may be in a range of about 12 mm to about 22 mm.

The second magnet member may include a second magnet main body, which is arranged in parallel to the first magnet main body and spaced apart from the first magnet main body with a first gap in the second direction, and second magnet end portions, which are positioned at both ends of the second magnet main body, face the first magnet extension, and spaced apart from the first magnet extension with a second gap in the first direction, a width, in the second direction, of the first gap may be in a range of about 25 mm to about 35 mm, and a width, in the first direction, of the second gap may be in a range of about 12 mm to about 22 mm.

The deposition apparatus may further include a substrate fixing unit supporting a substrate in the chamber; and a deposition target disposed to face the substrate, wherein the at least one magnet unit may be positioned below the deposition target.

According to an embodiment of the disclosure, a deposition apparatus may include a chamber having a deposition target disposed in its internal space; and a plurality of magnet units positioned below the deposition target, each of the plurality of magnet units including a first magnet member, which extends in a first direction, and a second magnet member, which is spaced apart from the first magnet member and completely surrounds the first magnet member. The plurality of magnet units may be spaced apart from one another in a second direction intersecting the first direction, and the first magnet member of each of the plurality of magnet units may include penetration holes at both ends of the first magnet member in the first direction.

End portions of each of the plurality of magnet units may be aligned on a virtual straight line extending in the second direction.

A central area of the first magnet member in the first direction may have a width in the second direction smaller than a width in the second direction of each of end portions of the first magnet member in the first direction.

The second magnet member may have a hollow closed-loop shape in a plan view, and the first magnet member may be positioned inside the hollow closed-loop of the second magnet member.

In accordance with the aforementioned and other embodiments of the disclosure, it may be possible to prevent localized overconsumption in specific areas of a deposition target, such as localized overconsumption resulting in the formation of holes in the specific areas of the deposition target. Consequently, it may be possible to reduce the frequency of premature replacement of the deposition target due to such overconsumption.

Furthermore, by preventing the occurrence of holes caused by localized overconsumption in the specific areas of the deposition target, it may be possible to ensure uniformity in deposition quality, stabilize a deposition process, and enhance productivity.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
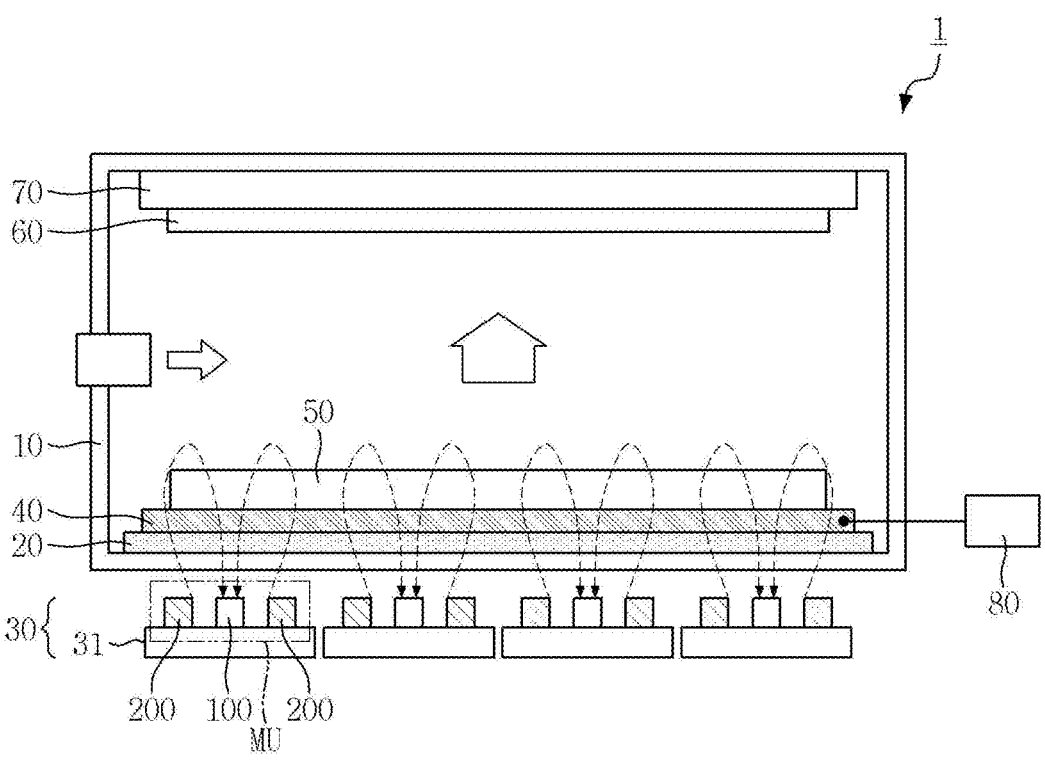
FIG. 1 is a schematic front view illustrating the configuration of a deposition apparatus according to an embodiment of the disclosure.

Embodiments of the disclosure will be described with reference to the attached drawings.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic front view illustrating the configuration of a deposition apparatus according to an embodiment of the disclosure.

Referring to FIG. 1, a deposition apparatus 1 may be a magnetron sputtering apparatus, but the disclosure is not limited thereto. For example, the deposition apparatus 1 may be used in a thin-film transistor (TFT) fabricating device or a semiconductor manufacturing process for manufacturing a substrate applicable to an integrated circuit (IC) device, a display device, a solar cell, etc.

The deposition apparatus 1 may include a chamber 10, a protective sheet 20, which is positioned on a lower part of the chamber 10, a magnet module 30, which is positioned below the protective sheet 20, a back plate 40, which is positioned on the protective sheet 20, a deposition target 50, which is disposed on the back plate 40, a deposition substrate 60, which is positioned apart from the deposition target 50, and a substrate fixing unit 70, which fixes the deposition substrate 60 on an upper part of the chamber 10.

The chamber 10, which has a space where a deposition process takes place, may accommodate gas for generating plasma and may include a discharge space. Various gases may be used in the chamber 10. For example, an inert gas may be used, but the disclosure is not limited thereto.

The chamber 10 may receive gas through a gas supply unit. For example, the chamber 10 may use an inert gas such as argon (Ar) and neon (Ne), but the disclosure is not limited thereto. For example, the chamber 10 may use various other gases.

The chamber 10 may have a cubic shape with a rectangular cross-section, but the disclosure is not limited thereto. In another embodiment, the chamber 10 may have a polyhedral shape such as a hexahedron or an octahedron, or may have a cylindrical shape in a cross-sectional view.

The deposition substrate 60, which is a substrate onto which atoms ejected from a deposition target are deposited, may be formed of an insulating material selected from a group consisting of glass, quartz, ceramic, and plastic, or may be formed of a metallic material such as stainless steel, but the disclosure is not limited thereto.

The deposition substrate 60 may be disposed in the chamber 10 and may be supported by the substrate fixing unit 70 at the top of the chamber 10. The deposition substrate 60 may be spaced apart from the deposition target 50, which is positioned on the lower part of the chamber 10, and may face the deposition target 50.

The deposition target 50 may include various materials depending on the type of thin film to be deposited on the deposition substrate 60. For example, the deposition target 50 may include a metal or a metal oxide, but the disclosure is not limited thereto.

For example, the deposition target 50 may include a metal such as aluminum, titanium, copper, molybdenum, gold, silver, indium, zinc, tin, or silicon. For example, the deposition target 50 may include a metal oxide such as indium oxide, zinc oxide, tin oxide, indium zinc oxide, indium tin oxide, indium zinc tin oxide, or indium zinc gallium oxide.

The back plate 40 may support the deposition target 50 and may serve as a cathode for generating plasma by receiving voltage.

The back plate 40 may be electrically connected to a power source 80. The power source 80 may provide radio frequency (RF) power or direct current (DC) power to the back plate 40. In case that voltage is applied to the back plate 40, plasma discharge may occur in the chamber 10, allowing for ionization of an inert gas. Here, the inert gas may be used, but the disclosure is not limited thereto.

In case that ionized particles are accelerated toward the deposition target 50 and collide with the deposition target 50, atoms may be ejected from the deposition target 50. The ejected atoms may move toward the deposition substrate 60 to form a thin film on the deposition substrate 60.

The protective sheet 20 may be disposed between the back plate 40 and the magnet module 30 and may include a fluorine-based resin such as polytetrafluoroethylene (PTFE).

The magnet module 30 may be disposed below the back plate 40 with the protective sheet 20 interposed between the magnet module 30 and the back plate 40. During plasma generation, the magnet module 30 may form a magnetic field, increasing plasma density and deposition rate.

For example, the magnetic field formed by the magnet module 30, which is disposed adjacent to the deposition target 50, may capture electrons and generate high-density plasma, thereby increasing the deposition rate. In case that positive ions of the plasma collide with the deposition target 50, the positive ions dislodge small particles from the deposition target 50, and the small particles from the deposition target 50 may be deposited onto the deposition substrate 60 facing the deposition target 50.

The magnet module 30 may be coupled with the back plate 40 to form a cathode module. For example, the cathode module may be disposed in the chamber 10 or may be inserted into the chamber 10 while being positioned in part in the chamber 10. The magnet module 30 and the back plate 40 may be arranged and coupled in various configurations, and the magnet module 30 may be disposed inside or outside the chamber 10 depending on the configuration. However, the disclosure is not limited to this.

Figure 2:
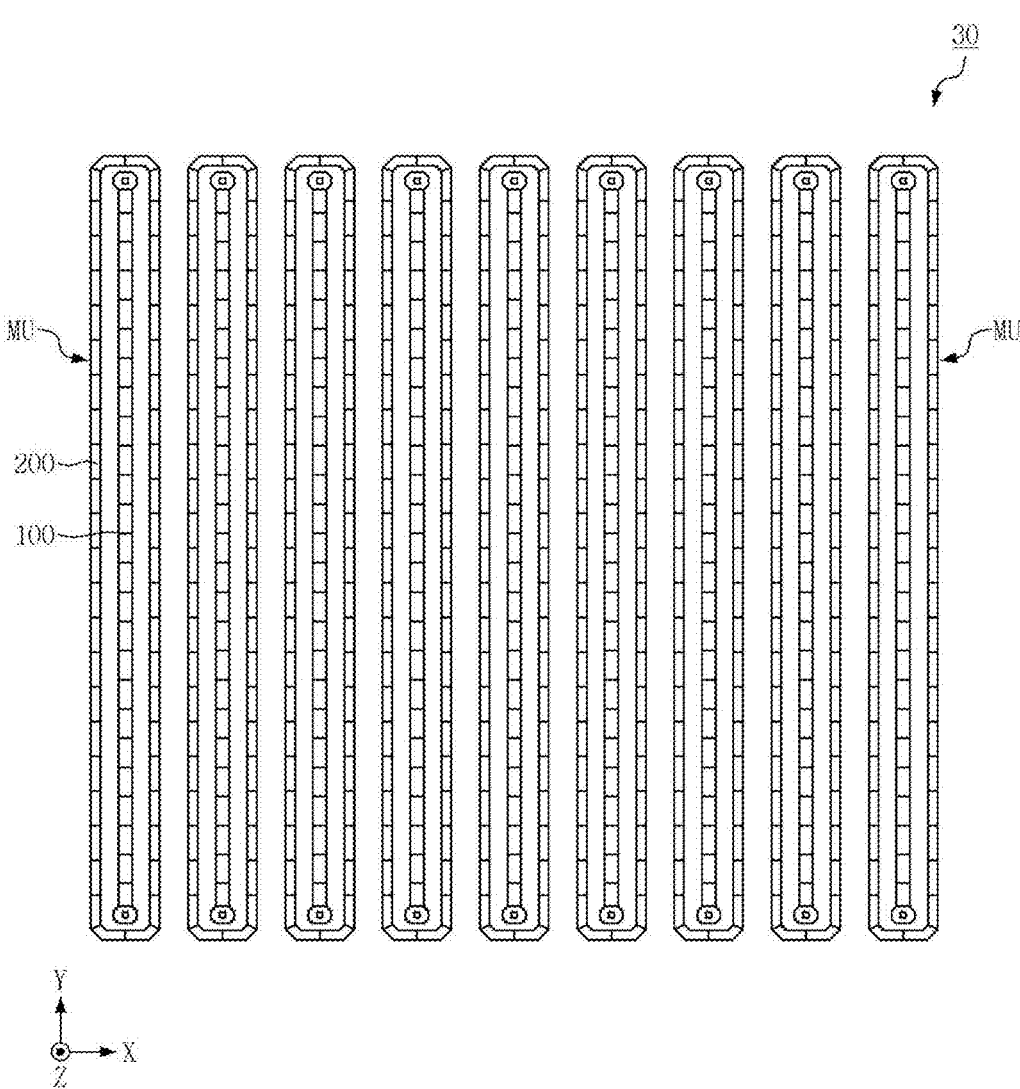
FIG. 2 is a plan view illustrating multiple magnet units in the deposition apparatus of FIG. 1.
Figure 3:
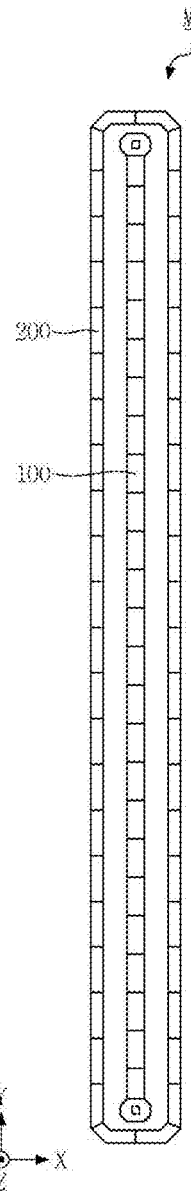
FIG. 3 is a plan view illustrating one of the magnet units of FIG. 2.
Figure 4:
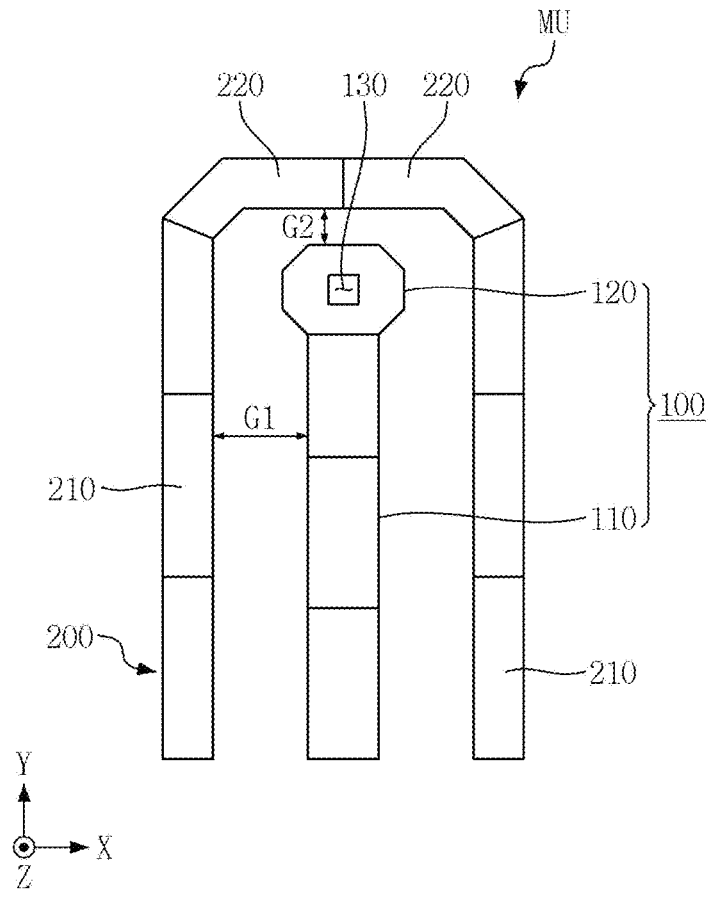
FIG. 4 is an enlarged plan view illustrating an end portion of the magnet unit of FIG. 3.
Figure 5:
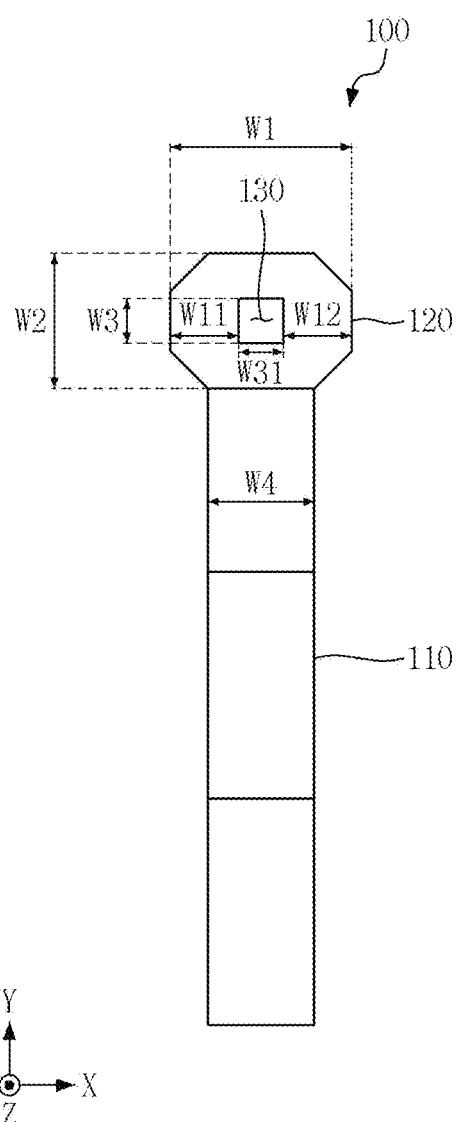
FIG. 5 is an enlarged partial plan view illustrating a first magnet member of FIG. 4.

FIG. 2 is a plan view illustrating multiple magnet units in the deposition apparatus of FIG. 1, FIG. 3 is a plan view illustrating one of the magnet units of FIG. 2, FIG. 4 is an enlarged plan view illustrating an end portion of the magnet unit of FIG. 3, and FIG. 5 is an enlarged partial plan view illustrating a first magnet member of FIG. 4.

Referring to FIGS. 1 and 2, the magnet module 30 may include multiple magnet units MU, which are arranged in a second direction X, and multiple support plates 31, which support the magnet units MU. The magnet units MU may be positioned on the respective support plates 31.

Referring to FIG. 2, the magnet units MU may be arranged at intervals of a distance in the second direction X. The spacing between adjacent magnet units MU may be less than the length, in a first direction Y, of the magnet units MU.

The magnet units MU may be aligned such that end portions of the magnet units MU may be arranged on a same line along the second direction X, but the disclosure is not limited thereto. In another embodiment, the magnet units MU may not be aligned with one another.

Referring to FIGS. 3 and 4, a magnet unit MU may include a first magnet member 100, which is an internal magnet, and a second magnet member 200, which is an external magnet.

The first magnet member 100 may generate a magnetic field around the deposition target 50 together with the second magnet member 200.

The first magnet member 100 may possess a first polarity, which may be an S pole, and may be either a permanent magnet or an electromagnet, but the disclosure is not limited thereto.

The first magnet member 100 and the second magnet member 200 may have a same thickness, i.e., a same height in a third direction Z, but the disclosure is not limited thereto. In another embodiment, the first and second magnet members 100 and 200 may have different thicknesses, i.e., different heights in the third direction Z.

The first magnet member 100 may have a greater width in the second direction X at its both end portions than at its middle portion in its elongation direction, i.e., the first direction Y. The first magnet member 100 may be wider at its both end portions than at its middle portion or may be wider at only one of its both end portions than at its middle portion.

Referring to FIG. 4, the first magnet member 100 may include a first magnet main body 110, which is in the shape of a long bar, and first magnet extensions 120, which are positioned at ends of the first magnet main body 110 and have a width greater than the first magnet main body 110 in the second direction X.

The first magnet main body 110 may have a long bar shape along the first direction Y in a plan view, but the disclosure is not limited thereto. In another embodiment, the first magnet main body 110 may have a long rectangular bar shape, a polygonal bar shape, or a circular bar shape. The first magnet main body 110 may consist of a single long magnet block or may be formed by connecting multiple separate magnet blocks. Here, the multiple magnet blocks may have a same size or different sizes, or at least some of the multiple magnet blocks may have a same size. In an embodiment, the multiple magnet blocks may be combined together without gaps between the multiple magnet blocks or with gaps between at least some of the multiple magnet blocks. However, the disclosure is not limited to these examples.

The planar shape of the first magnet extensions 120 may be polygonal. For example, in a plan view, the shape of the first magnet extensions 120 may be defined by the edges of the first magnet extensions 120. For example, if the first magnet extensions 120 have a polygonal shape with an internal angle, the erosion rate may be further reduced. For example, if the first magnet extensions 120 have an octagonal shape with multiple sides, collisions with the multiple sides may slow down the velocity of plasma, further lowering the erosion rate. However, the disclosure is not limited to this example. In another embodiment, the first magnet extensions 120 may have other polygonal shapes such as a quadrilateral, hexagonal, or dodecagonal shape or a non-polygonal shape such as a circular or elliptical shape.

Referring to FIG. 5, a width W1, in the second direction X, of the first magnet extensions 120 may be greater than a width W4, in the second direction X, of the first magnet main body 110.

For example, the width W1, in the second direction X, of the first magnet extensions 120 may be about 1.5 to about 2.9 times greater than the width W4, in the second direction X, of the first magnet main body 110.

The width W4, in the second direction X, of the first magnet main body 110 may be in a range of about 19 mm to about 29 mm. For example, the width W4, in the second direction X, of the first magnet main body 110 may be about 24 mm, but the disclosure is not limited thereto.

The width W1, in the second direction X, of the first magnet extensions 120 may be in a range of about 45 mm to about 55 mm. For example, the width W1, in the second direction X, of the first magnet extensions 120 may be about 50 mm, but the disclosure is not limited thereto. A width W2, in the first direction Y, of the first magnet extensions 120 may be in a range of about 25 mm to about 35 mm. For example, the width W2, in the first direction Y, of the first magnet extensions 120 may be about 30 mm, but the disclosure is not limited thereto.

Each of the end portions of the first magnet extensions 120 at the ends of the first magnet member 100 in the first direction Y may include one or more corners C, as will be described below with reference to FIG. 10. The corners C at the ends of the first magnet extensions 120 may also be referred to as corners C of the first magnet member 100. As the first magnet extensions 120 have a width greater than the first magnet main body 110, plasma may be guided as outwardly as possible around the corners C, as indicated by arrows in FIG. 10, and as a result, the concentration of the plasma around the corners C of the first magnet member 100 may be prevented.

Figure 6:
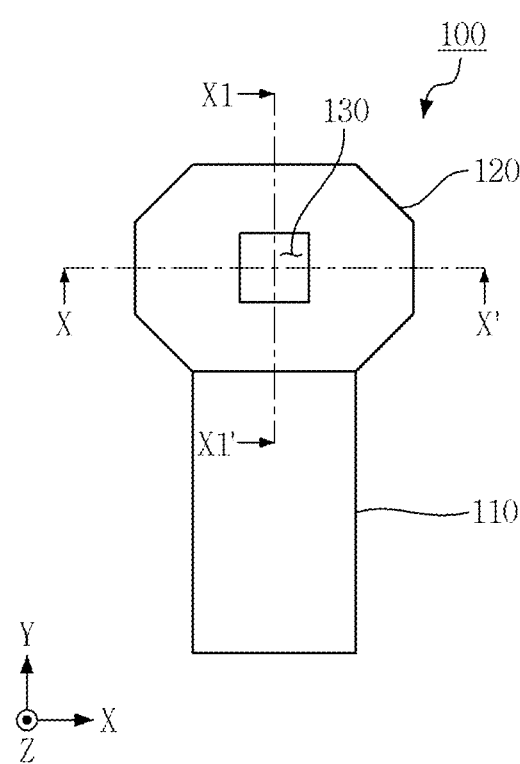
FIG. 6 is an enlarged plan view illustrating a first magnet extension of the first magnet member of FIG. 5.
Figure 7:
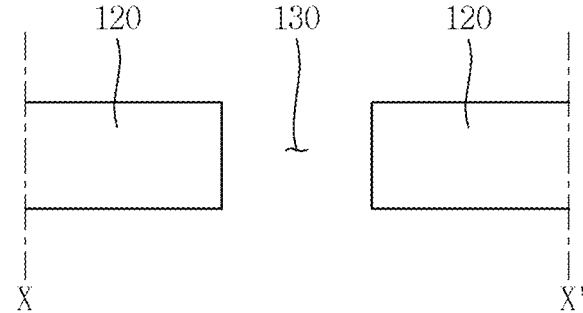
FIG. 7 is a schematic cross-sectional view taken along line X-X' of FIG. 6.
Figure 8:
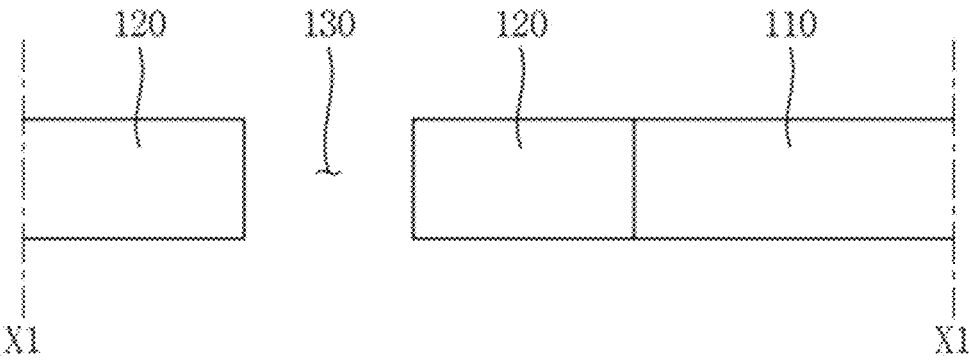
FIG. 8 is a schematic cross-sectional view taken along line X1-X1' of FIG. 6.

FIG. 6 is an enlarged plan view illustrating a first magnet extension of the first magnet member of FIG. 5, FIG. 7 is a schematic cross-sectional view taken along line X-X' of FIG. 6, and FIG. 8 is a schematic cross-sectional view taken along line X1-X1' of FIG. 6.

Referring to FIGS. 5 and 6, the first magnet extension 120 may include a penetration hole 130 and first and second regions on the left and right sides of the penetration hole 130, respectively.

Widths W11 and W12, in the second direction X, of the first and second regions, respectively, may be smaller than the width W4, in the second direction X, of the first magnet main body 110. In an embodiment, the sum of the widths W11 and W12 of the first and second regions may be greater than the width W4 of the first magnet main body 110.

In some embodiments, the sum of the widths W11 and W12 of the first and second regions may be about 0.9 to about 2.6 times greater than the width W4 of the first magnet main body 110.

The widths W11 and W12 of the first and second regions may each be in a range of about 14 mm to about 24 mm. For example, the widths W11 and W12 of the first and second regions may each be about 19 mm.

The penetration hole 130 may be positioned in the corresponding first magnet extension 120, for example, all the boundaries of the penetration hole 130 may be spaced apart from the edges of the corresponding first magnet extension 120, and the penetration hole 130 may have a closed-loop shape in a plan view.

The penetration hole 130 may have various shapes such as a triangular, square, rectangular, circular, or elliptical shape in a plan view.

In case that the penetration hole 130 has a square planar shape, a width W31, in the second direction X, of the penetration hole 130 and a width W3, in the first direction Y, of the penetration hole 130 may be the same.

The widths W3 and W31 of the penetration hole 130 may be smaller than the width W4 of the first magnet main body 110. For example, the width W4 of the first magnet main body 110 may be about 1.1 to about 4.2 times greater than the widths W3 and W31 of the penetration hole 130.

The width W31 of the penetration hole 130 may be in a range of about 7 mm to about 17 mm. For example, the width W31 of the penetration hole 130 may be about 12 mm. In case that the penetration hole 130 has a square shape, the widths W3 and W31 of the penetration hole 130 may be the same.

Referring to FIG. 7, the penetration hole 130 may have a hole shape penetrating the first magnet extension 120 in the third direction Z, which is a thickness direction.

The penetration hole 130 may have a rectangular shape in a cross-sectional view, penetrating the first magnet extension 120 in the third direction Z, but the disclosure is not limited thereto. In another embodiment, the penetration hole 130 may have various other shapes such as a triangular, polygonal, circular, or elliptical shape.

Referring to FIG. 8, in a cross-sectional view, the thickness of the first magnet extension 120 with the penetration hole 130 and the thickness of the first magnet main body 110 may be the same, but the disclosure is not limited thereto. In another embodiment, the thickness of the first magnet extension 120 may be less than the thickness of the first magnet main body 110.

Since the penetration hole 130 is provided in the first magnet extension 120, the area occupied by the magnet part of the first magnet extension 120 may decrease. The intensity of the magnetic field between the first and second magnet members 100 and 200 may be correlated with the magnet areas of the first and second magnet members 100 and 200. For example, as the magnet areas of the first and second magnet members 100 and 200 increase, the intensity of the magnetic field between the first and second magnet members 100 and 200 may increase, and as the magnet areas of the first and second magnet members 100 and 200 decreases, the intensity of the magnetic field between the first and second magnet members 100 and 200 may decrease. Therefore, the area of the penetration hole 130 may be a variable determining the intensity of the magnetic field between the first and second magnet members 100 and 200. By adjusting the area of the penetration hole 130, an appropriate magnetic field intensity may be set between the first and second magnet members 100 and 200.

For example, as will be described below with reference to FIG. 10, the spacing between the first and second magnet members 100 and 200 may be narrower in the corners C of FIG. 10, where the magnetic field intensity may increase, but the penetration hole 130 may reduce the area of the first magnet extension 120, lowering the magnetic field intensity. As the magnetic field intensity decreases and consequently the plasma density decreases, the erosion of the deposition target 50 in areas corresponding to the corners C with reduced plasma density may be reduced, and as a result, the generation of abnormal etching holes on the deposition target 50 may be prevented.

Figure 9:
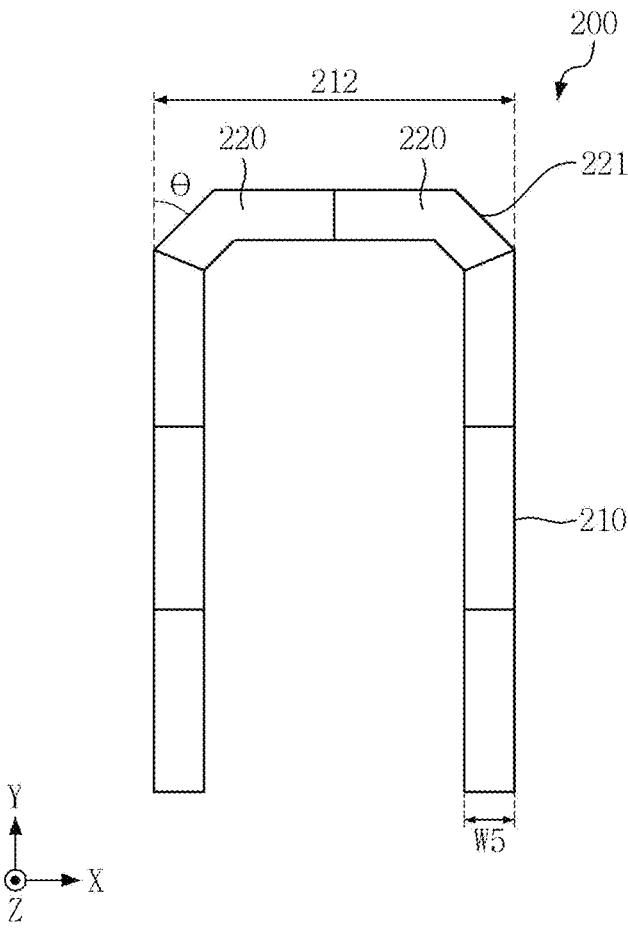
FIG. 9 is an enlarged partial plan view illustrating a second magnet member of FIG. 4.

FIG. 9 is an enlarged plan view illustrating the second magnet member of FIG. 4.

Referring to FIGS. 4 and 9, the second magnet member 200 may generate a magnetic field on the deposition target 50 together with the first magnet member 100.

The second magnet member 200 may have a polarity opposite to the first magnet member 100 and may be either a permanent magnet or an electromagnet.

For example, if the first magnet member 100 is an S-pole magnet, the second magnet member 200 may be an N-pole magnet, but the disclosure is not limited thereto. For example, if the first magnet member 100 is an N-pole magnet, the second magnet member 200 may be an S-pole magnet.

The second magnet member 200 and the first magnet member 100 may have a same thickness, i.e., a same height in the third direction Z, but the disclosure is not limited thereto. In another embodiment, the second magnet member 200 and the first magnet member 100 may have a different thickness, i.e., a different height in the Z direction.

The second magnet member 200 may consist of a single integral magnet or may be formed by connecting multiple separate magnet blocks. Here, the multiple magnet blocks may have a same size or different sizes, or at least some of the multiple magnet blocks may have a same size. In an embodiment, the multiple magnet blocks may be combined together without gaps between the multiple magnet blocks or with gaps between at least some of the multiple magnet blocks. However, the disclosure is not limited to these examples.

The second magnet member 200 may have a hollow closed-loop shape in a plan view and may accommodate the first magnet member 100 within the empty internal space of the second magnet member 200, surrounding the first magnet member 100 from outside the first magnet member 100.

In another embodiment, the second magnet member 200 may have various polygonal shapes such as a square, pentagonal, hexagonal, or octagonal shape, or an elongated circular or elliptical shape in a plan view.

The second magnet member 200 may include a second magnet main body 210, which is disposed in parallel to the first magnet main body 110, and second magnet end portions 220, which are positioned at ends of the second magnet main body 210 and face the first magnet extensions 120 of the first magnet member 100.

A width W5, in the second direction X, of the second magnet main body 210 may be smaller than the width W4, in the second direction X, of the first magnet main body 110.

The width W5, in the second direction X, of the second magnet main body 210 may be in a range of about 12 mm to about 22 mm. For example, the width W5, in the second direction X, of the second magnet main body 210 may be about 17 mm, but the disclosure is not limited thereto.

Each of the second magnet end portions 220 may include inclined portions 221, which are inclined at a uniform inclination angle θ relative to a straight line in the first direction Y. The inclination angle θ may be about 45 degrees, but the disclosure is not limited thereto.

Figure 10:
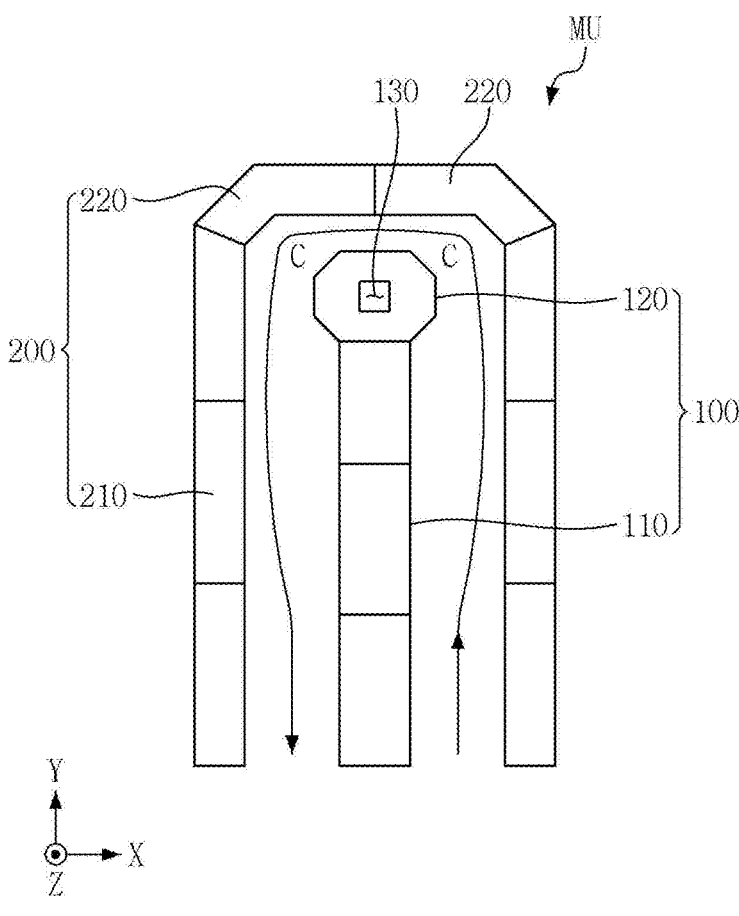
FIG. 10 illustrates the trajectory of plasma in the magnet unit of FIG. 4.

The second magnet end portions 220 may form the corners C of FIG. 10 at the ends of the first magnet member 100, together with the first magnet extensions 120.

In the internal space of the second magnet member 200, the first magnet member 100 may be positioned with gaps (G1 and G2 in FIG. 4) between the first magnet member 100 and the second magnet member 200.

Referring to FIGS. 4 and 9, the gaps (G1 and G2) may include first gaps G1, which are positioned between the second magnet main body 210 and the first magnet main body 110, and second gaps G2, which are positioned between the second magnet end portions 220 and the first magnet extensions 120.

The width of the first gaps G1 in the second direction X may be in a range of about 25 mm to about 35 mm. For example, the width of the first gaps G1 may be about 31 mm, but the disclosure is not limited thereto.

The second gaps G2 may be spaces between the inner sides of the second magnet end portions 220 and the outer sides of the ends of the first magnet extensions 120, and the corners C of FIG. 10 may be positioned adjacent to the second gaps G2.

The width of the second gaps G2 may be in a range of about 12 mm to about 22 mm. For example, the width of the second gaps G2 may be about 17 mm, but the disclosure is not limited thereto.

Figure 11:
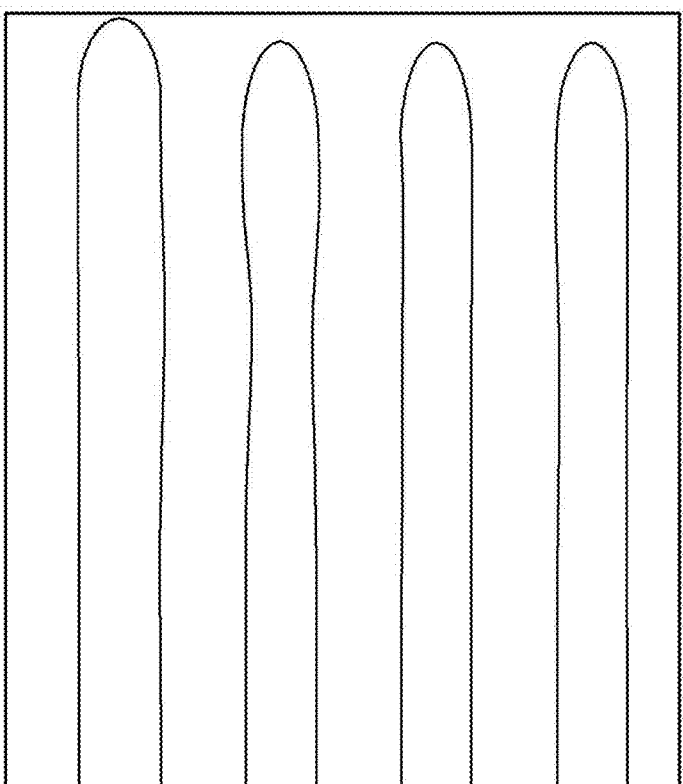
FIG. 11 illustrates the shape of plasma according to the magnetic field of the magnet unit of FIG. 10.
Figure 12:
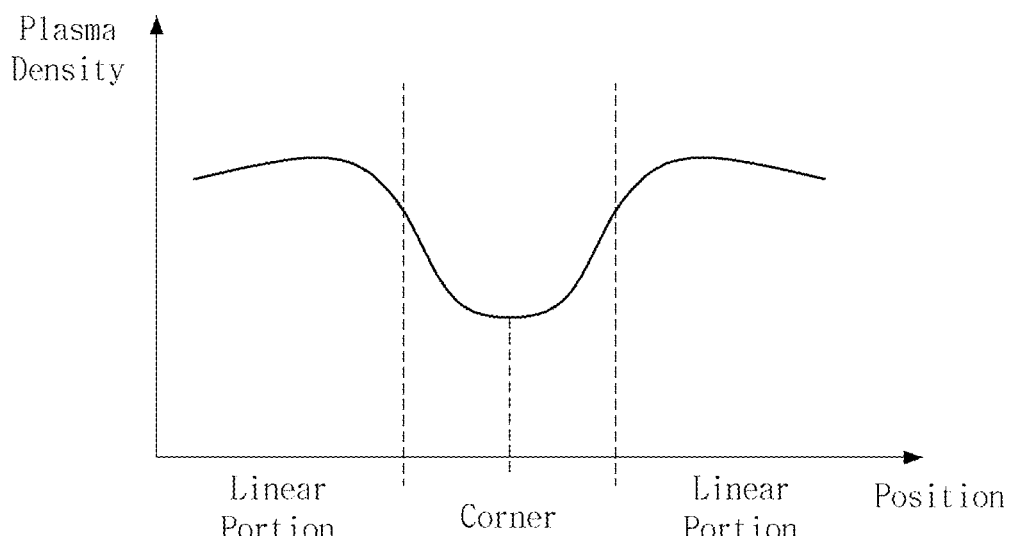
FIG. 12 is a graph showing plasma density according to the magnetic field of the magnet unit of FIG. 10.
Figure 13:
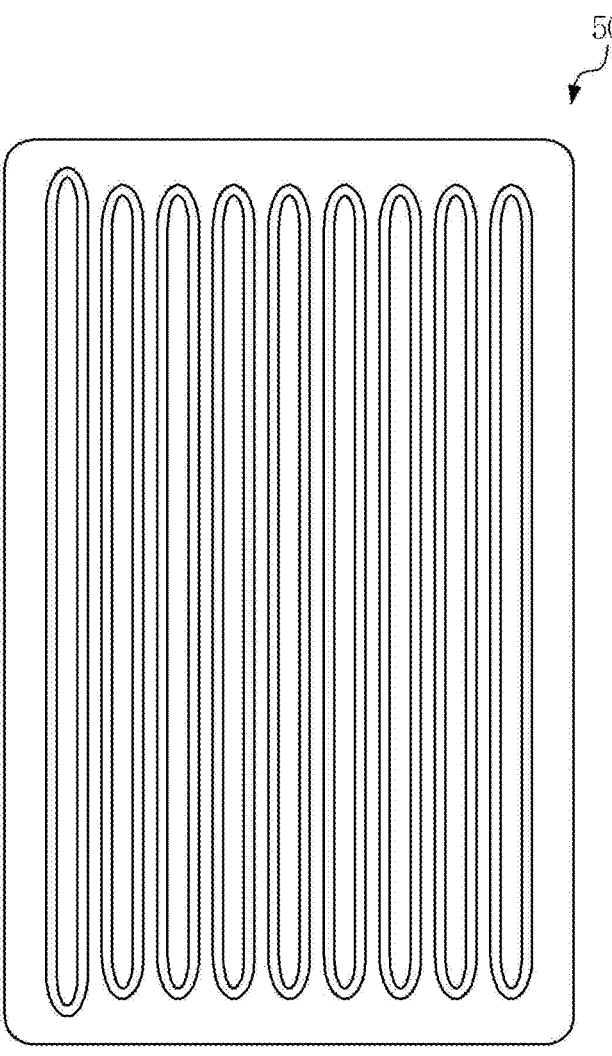
FIG. 13 illustrates the deposition target after use that corresponds to the configuration of the magnet unit of FIG. 10.

FIG. 10 schematically illustrates the trajectory of plasma in the magnet unit of FIG. 4, FIG. 11 schematically illustrates the shape of plasma according to the magnetic field of the magnet unit of FIG. 10, FIG. 12 is a graph showing plasma density according to the magnetic field of the magnet unit of FIG. 10, and FIG. 13 schematically illustrates the deposition target after use that corresponds to the configuration of the magnet unit of FIG. 10.

Referring to FIG. 10, arrows may indicate the trajectory of plasma generated in response to a magnetic field generated by the first and second magnet members 100 and 200, and in accordance with the plasma trajectory depicted in FIG. 10, plasma shapes spreading widely in boundary regions may appear in the corners C, as illustrated in FIG. 11.

FIG. 11 schematically illustrates an embodiment where first magnet extensions 120 and the penetration holes 130 are applied to a single magnet unit MU on an outermost side of the magnet module 30, among other magnet units MU, but the disclosure is not limited thereto. For example, the first magnet extensions 120 and the penetration holes 130 may be applied to at least one of the magnet units MU of the magnet module 30. In an embodiment, the first magnet extensions 120 and the penetration holes 130 may be applied to all the magnet units MU, or only to magnet units MU on the outermost sides, in the second direction X, of the magnet module 30.

Referring to FIG. 11, due to the induction and guidance by the first magnet extensions 120 and the penetration holes 130, plasma shapes that become wider in outward directions may be formed in the corners C. For example, as the density of plasma that may have been concentrated in the corners C otherwise can be lowered, as shown in FIG. 12, wider plasma shapes may be formed. Consequently, referring to FIG. 13, heavy erosions in the corners C of the deposition target 50 due to the concentration of plasma at the corners C may be prevented, and the deposition target 50 may be etched more extensively in the outward directions from the corners C.

Furthermore, as illustrated in FIG. 13, as the erosion rate in the corners C of the deposition target 50 is lowered by as much as the amount by which the plasma trajectory is elongated and the etched area of the deposition target 50 is significantly expanded toward its boundaries, the efficiency of utilization of the deposition target 50 may be enhanced.

Overlapping plasma positions during oscillating movement of the magnet module 30 including multiple first magnet members 100 and multiple second magnet members 200 may be dispersed, and the first magnet extensions 120 and the penetration holes 130 may guide plasma to spread outwardly from the corners C without being concentrated at the corners C alone, minimizing overall magnetic field changes. By minimizing such overall magnetic field changes, cross-corner effects resulting from abnormal erosions at the corners C may be prevented.

Referring to FIG. 13, after deposition (i.e., after use), the deposition target 50 may be transformed to correspond to the arrangement of the first magnet members 100 and the second magnet members 200, which generate a magnetic field. The shape of the deposition target 50 after deposition, i.e., the etched shape or eroded shape of the deposition target 50, may be completely or almost identical to the arrangement shape of the first magnet members 100 and the second magnet members 200, as depicted in FIG. 13, but the disclosure is not limited thereto. For example, variations in the shapes of the first magnet members 100 and the second magnet members 200 during deposition may lead to plasma shape differences during deposition. Consequently, these plasma shape differences may result in variations in the eroded or etched shape of the deposition target 50, i.e., variations in the croded pattern of the deposition target 50 after deposition (i.e., after use).

Figure 14:
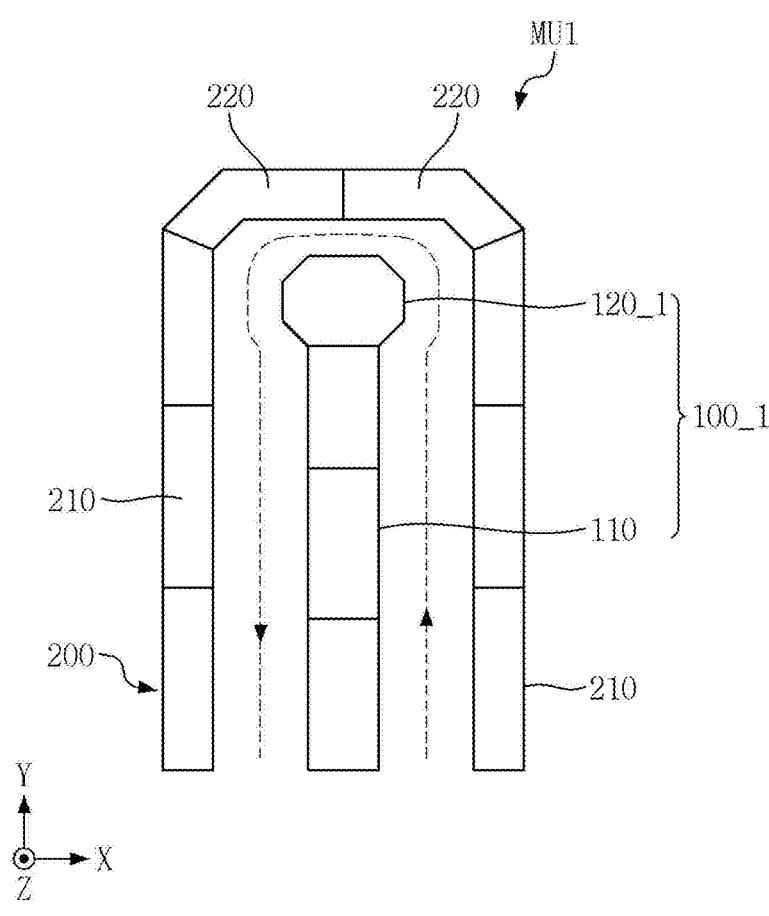
FIG. 14 illustrates the trajectory of plasma for a magnet unit without the penetration hole of FIG. 10.
Figure 15:
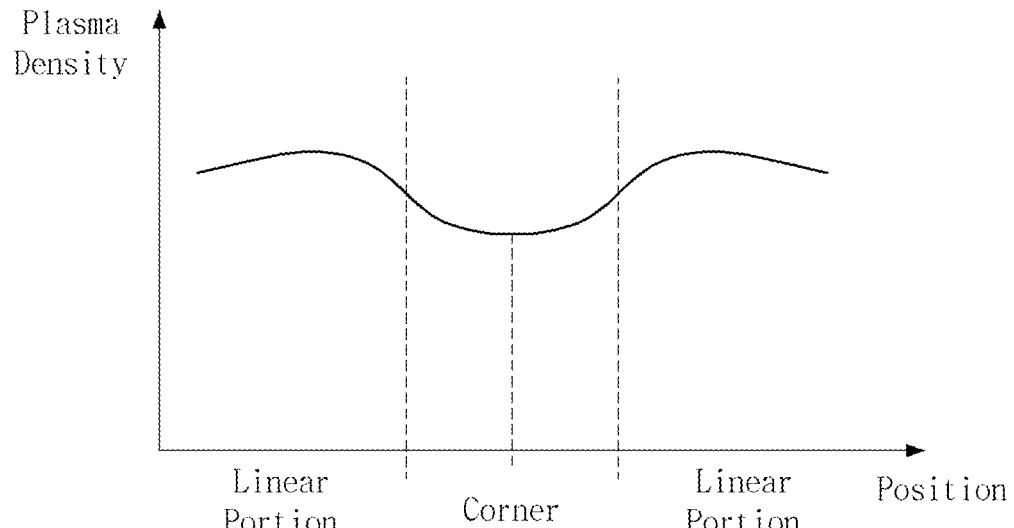
FIG. 15 is a graph showing the density of plasma according to the magnetic field of the magnet unit of FIG. 14.
Figure 16:
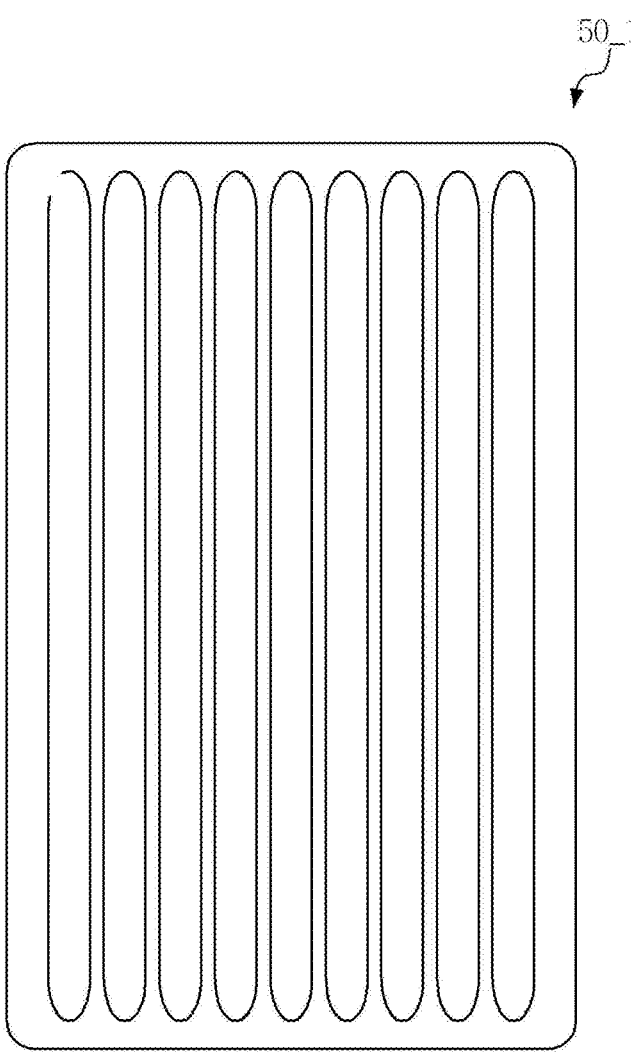
FIG. 16 illustrates a deposition target after use that corresponds to the shape of the magnet unit of FIG. 14.

FIG. 14 schematically illustrates the trajectory of plasma for a magnet unit without the penetration hole of FIG. 10, FIG. 15 is a graph showing the density of plasma according to the magnetic field of the magnet unit of FIG. 14, and FIG. 16 schematically illustrates a deposition target after use that corresponds to the shape of the magnet unit of FIG. 14.

FIGS. 14, 15, and 16 schematically illustrate a magnet unit MU1 according to a comparison example, which differs from the magnet unit MU of FIG. 10, and in the magnet unit MU1, the penetration hole 130 of FIG. 10 is not formed.

Referring to the magnet unit MU1 of FIG. 14, arrows may indicate the trajectory of plasma generated in response to a magnetic field being generated by a first magnet member 100_1 with no penetration holes 130 and a second magnet member 200.

In the example of FIG. 14 where the first magnet member 100_1 includes first magnet extensions 120_1 with no penetration holes 130, narrower plasma trajectories may appear in corners C than in the embodiment of FIG. 10 where the magnet unit MU includes first magnet extensions 120 with through holes 130. Accordingly, the area of a deposition target etched outwardly from the corners C may be smaller in the example of FIG. 14 than in the embodiment of FIG. 10.

FIG. 15 is a graph showing the density of plasma for the magnet unit MU1 of FIG. 14 with no penetration holes 130. Referring to FIGS. 12 and 15, the density of plasma in the corners C may be higher in the example of FIG. 14 without penetration holes 130 than in the embodiment of FIG. 10 with penetration holes 130.

FIG. 16 schematically illustrates a deposition target 50_1 with erosions after deposition using magnet units MU1 without penetration holes 130 shown in FIG. 14. Referring to FIGS. 13 and 16, small erosion holes may be observed in corners C of the deposition target 50_1 without penetration holes 130, contrasting with the absence of such erosion holes in the deposition target 50 with penetration holes 130.

Figure 17:
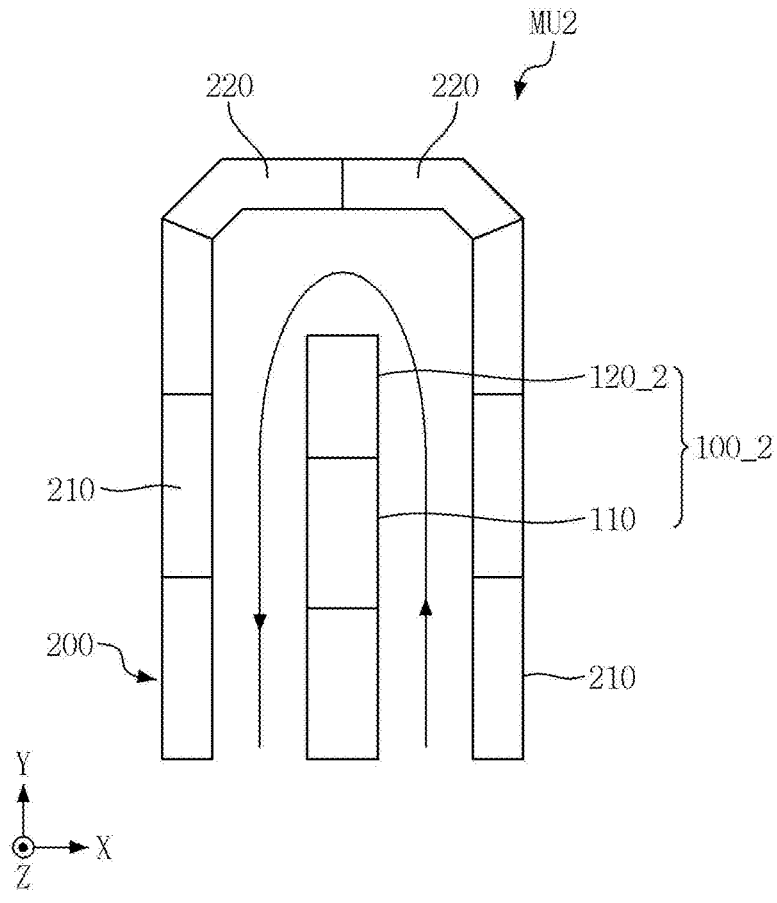
FIG. 17 illustrates the trajectory of plasma for a magnet unit without the first magnet extension and the penetration hole of FIG. 10.
Figure 18:
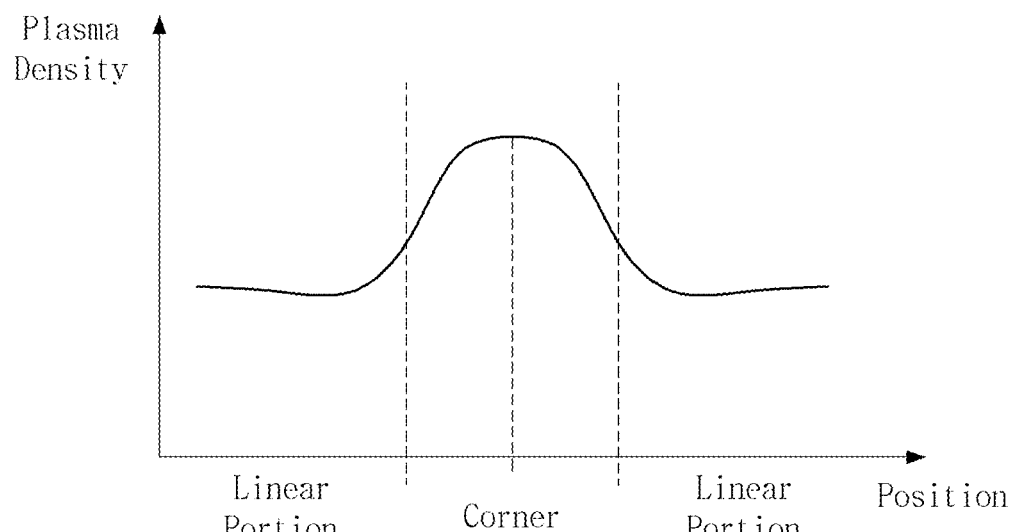
FIG. 18 is a graph showing the density of plasma according to the magnetic field of the magnet unit of FIG. 17.
Figure 19:
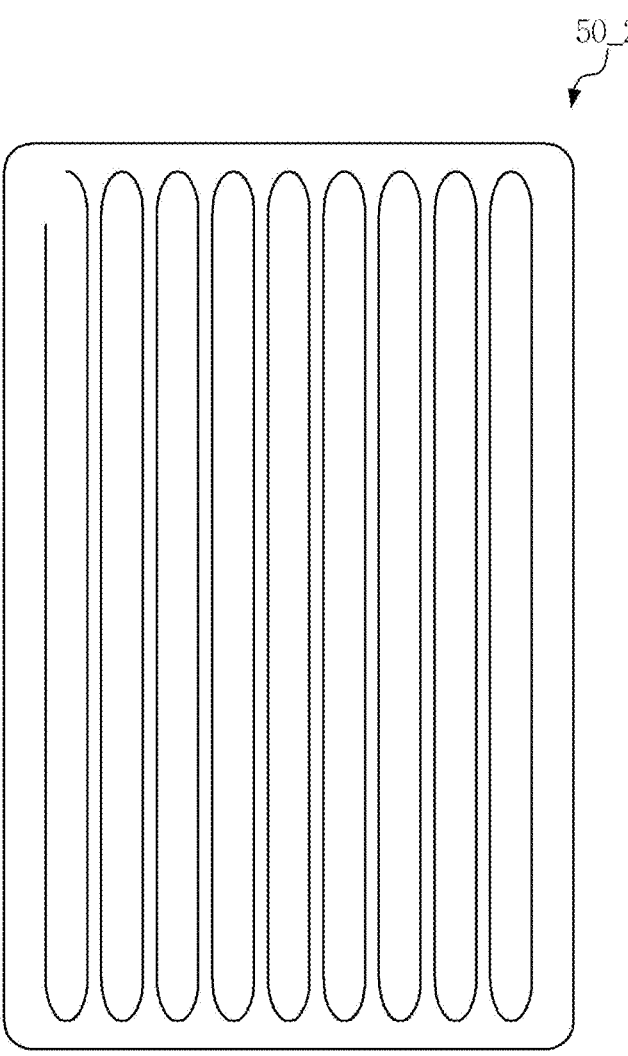
FIG. 19 illustrates a deposition target after use that corresponds to the configuration of the magnet unit of FIG. 17.

FIG. 17 schematically illustrates the trajectory of plasma for a magnet unit without the first magnet extension and the penetration hole of FIG. 10. FIG. 18 is a graph showing the density of plasma according to the magnetic field of the magnet unit of FIG. 17. FIG. 19 schematically illustrates a deposition target after use that corresponds to the configuration of the magnet unit of FIG. 17.

Referring to a magnet unit MU2 of FIG. 17, arrows may indicate the trajectory of plasma generated by a second magnet member 200 and a first magnet member 100_2 with neither first magnet extensions 120 nor penetration holes 130.

Referring to FIG. 17, plasma trajectories may rise significantly higher in corners C where the magnet unit MU2 includes end portions 120_2 without penetration holes 130 and first magnet extensions 120, as compared to the embodiment of FIG. 10. Consequently, the area of a deposition target 50_2 etched outwardly from the corners C may be smaller in the example of FIG. 17 than in the embodiment of FIG. 10.

FIG. 18 is a graph showing the density of plasma for the magnet unit MU2 of FIG. 17 without first magnet extensions 120 and penetration holes 130. Referring to FIGS. 12 and 18, the density of plasma may be considerably higher in the example of FIG. 17 where both first magnet extensions 120 and penetration holes 130 are absent than in the embodiment of FIG. 10 where both first magnet extensions 120 and penetration holes 130 are present. For example, FIG. 18 shows a significant increase in plasma density in the corners C in the example of FIG. 17 without first magnet extensions 120 and penetration holes 130.

FIG. 19 schematically illustrates the deposition target 50_2 with erosions after deposition using magnet units MU2 without first magnet extensions 120 and penetration holes 130 shown in FIG. 17. Referring to FIGS. 13 and 19, significant erosion holes are visible in corners C of the deposition target 50_2 without first magnet extensions 120 and penetration holes 130, contrary to the absence of such erosion holes in the deposition target 50 with penetration holes 130.

Moreover, erosion holes in the deposition target 50_2 of FIG. 19 without first magnet extensions 120 and penetration holes 130 exceed erosion holes in in the deposition target 50_1 of FIG. 16 with first magnet extensions 120_1 but no penetration holes 130.

For example, according to the embodiment of FIG. 10, the presence of both first magnet extensions 120 and penetration holes 130 may mitigates uneven erosions in the corners C of the deposition target 50 due to plasma concentration, thereby minimizing the occurrence of erosion holes in the corners C, compared to the examples of FIGS. 14 and 17, where penetration holes 130 are absent in the first magnet extensions 120_1 or where neither first magnet extensions 120 nor through holes 130 are present.

Structural variations in the magnet unit MU of FIG. 10, including the first magnet member 100 having the first magnet extensions 120 with the penetration holes 130, and the second magnet member 200, result in plasma shape differences during deposition. For example, as plasma conforms to the shape of the gap between the first and second magnet members 100 and 200, plasma shape variations may occur. Consequently, with the presence of the first magnet extensions 120 with the penetration holes 130, magnetic field intensity may decrease, and plasma density may decrease. As a result, erosion rates may decrease, preventing erosion holes from being formed in the corners C where the first magnet extensions 120 are positioned.

Magnet units according to embodiments of the disclosure will hereinafter be described.

FIGS. 20 through 23 are plan views illustrating magnet units according to embodiments of the disclosure.

The magnet units of FIGS. 20 through 23 may all have a same configuration as the magnet unit of FIG. 4, except for the shape of the penetration holes.

Figure 20:
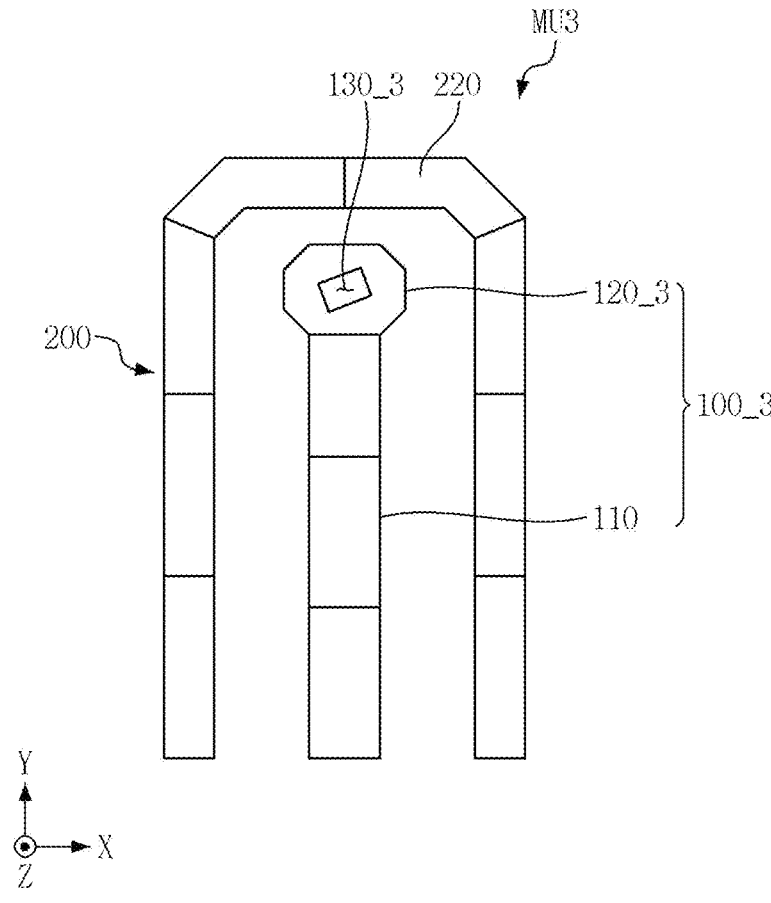
FIGS. 20 through 23 are plan views illustrating magnet units according to embodiments of the disclosure.

FIG. 20 is a plan view illustrating a magnet unit MU3 according to another embodiment of the disclosure.

Referring to FIG. 20, a penetration hole 130_3 of a first magnet extension 120_3 of a first magnet member 100_3 of the magnet unit MU3 may have a rectangular shape and may be downwardly inclined to the left along a first direction Y in a plan view, but the disclosure is not limited thereto. In another embodiment, the penetration hole 130_3 may be downwardly inclined to the right.

Figure 21:
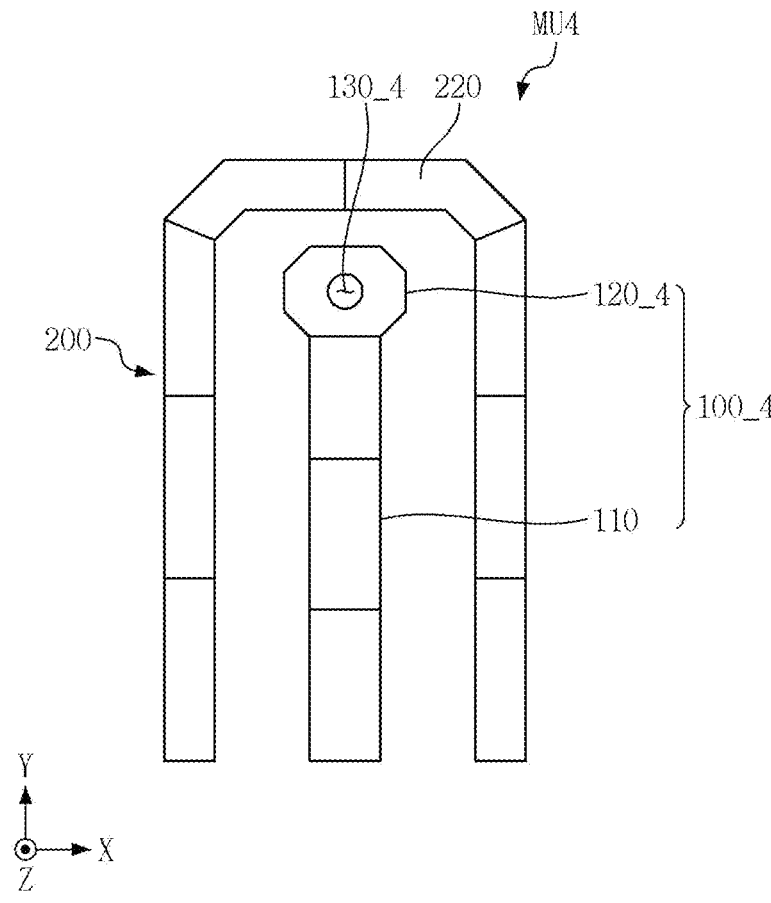

FIG. 21 is a plan view illustrating a magnet unit MU4 according to another embodiment of the disclosure.

Referring to FIG. 21, a penetration hole 130_4 of a first magnet extension 120_4 of a first magnet member 100_4 of the magnet unit MU4 may have a circular shape in a plan view, but the disclosure is not limited thereto. In another embodiment, the penetration hole 130_4 may have an elliptical shape. In an embodiment, the penetration hole 130_4 may be positioned in the central part of the first magnet extension 120_4, or may be positioned closer to an outer edge of the first magnet extension 120_4.

Figure 22:
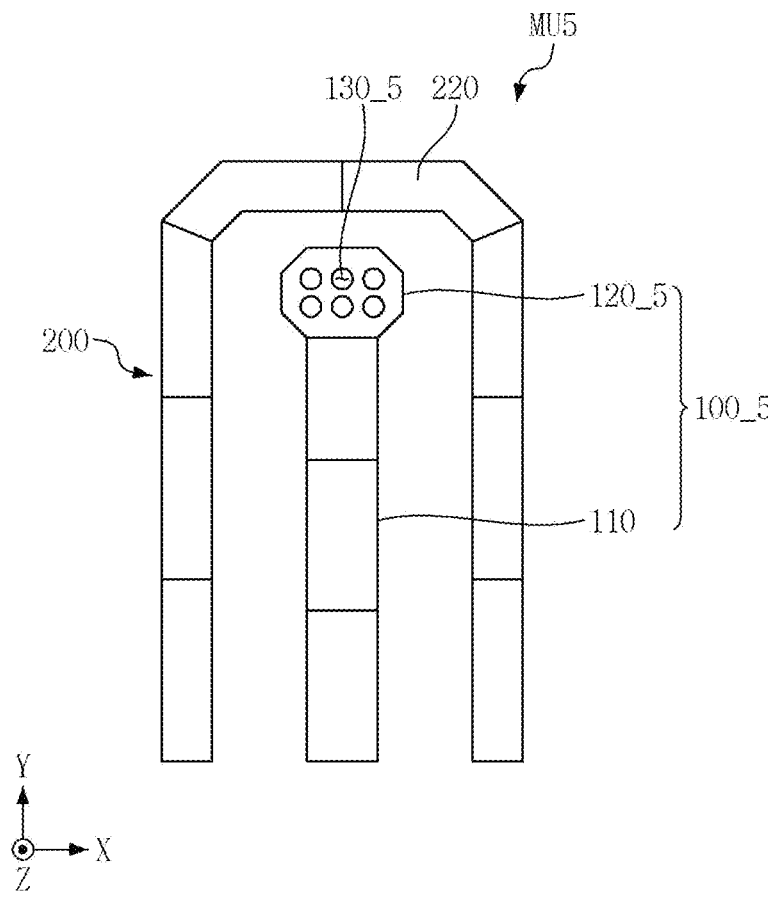

FIG. 22 is a plan view illustrating a magnet unit MUS according to another embodiment of the disclosure.

Referring to FIG. 22, a first magnet extension 120_5 of a first magnet member 100_5 of the magnet unit MU4 may include multiple circular penetration holes 130, but the disclosure is not limited thereto. The first magnet extension 120_5 may include multiple penetration holes 130_5 of various sizes.

Figure 23:
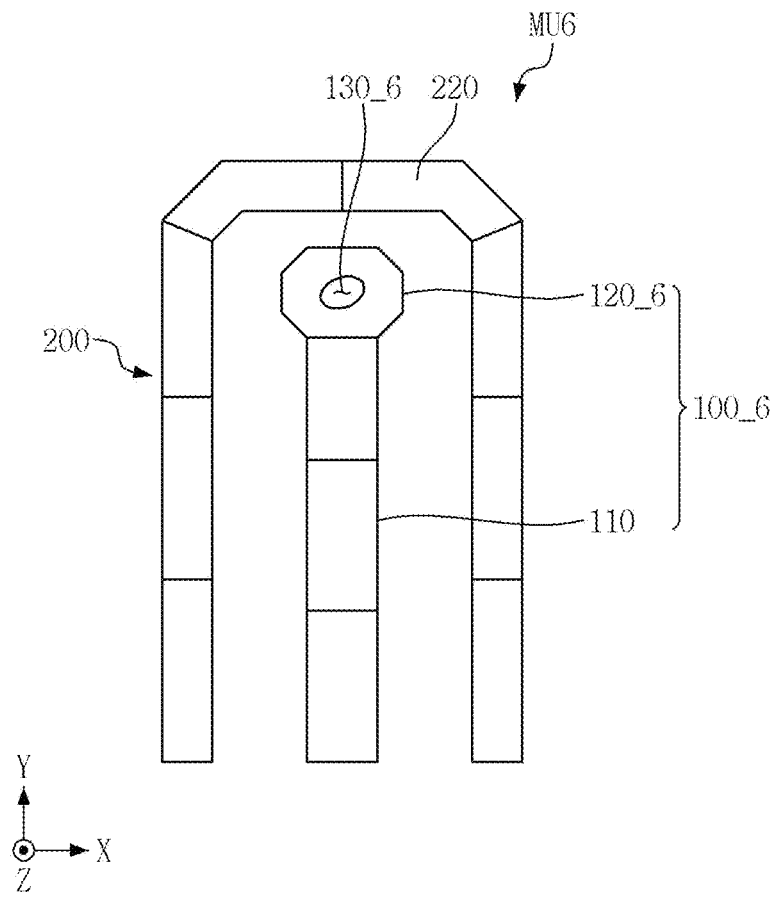

FIG. 23 is a plan view illustrating a magnet unit MU6 according to another embodiment of the disclosure.

Referring to FIG. 23, a penetration hole 130_6 of a first magnet extension 120_6 of a first magnet member 100_6 of the magnet unit MU6 may have an elliptical shape in a plan view and may be inclined, but the disclosure is not limited thereto. The penetration hole 130_6 may be downwardly inclined to the left or to the right along a first direction Y.

Using the magnet units MU, MU3, MU4, and MU6 of FIGS. 4, 20, 21, and 23, the efficiency of the deposition target 50 after use was assessed. The results indicate that the efficiency of the deposition target 50 employing magnet units with rectangular penetration holes (e.g., 130 and 130_3 of FIGS. 4 and 20) reaches 62.8%. The efficiency of the deposition target 50 is 62.3% employing magnet units with circular penetration holes (e.g., 130_4 of FIGS. 21) and 61.6% employing magnet units with elliptical penetration holes (e.g., 130_6 of FIG. 23). Thus, it is evident that employing magnet units with rectangular penetration (e.g., 130 and 130_3 of FIGS. 4 and 20) leads to higher deposition efficiency.

Figure 28:
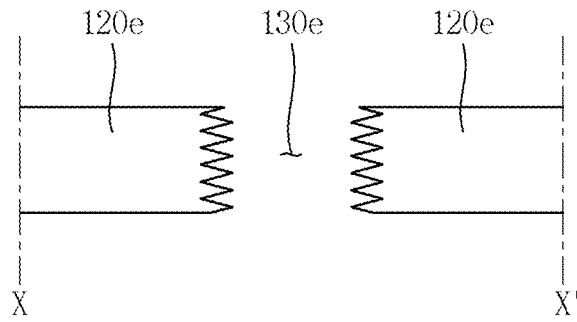
Figure 29:
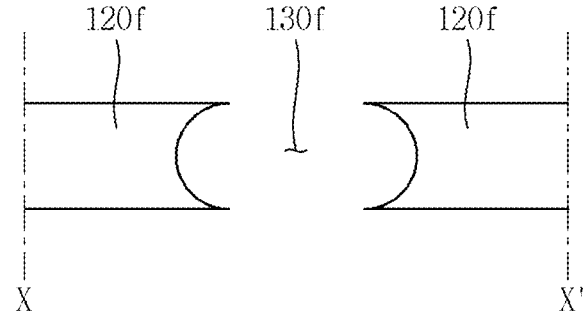
Figure 30:
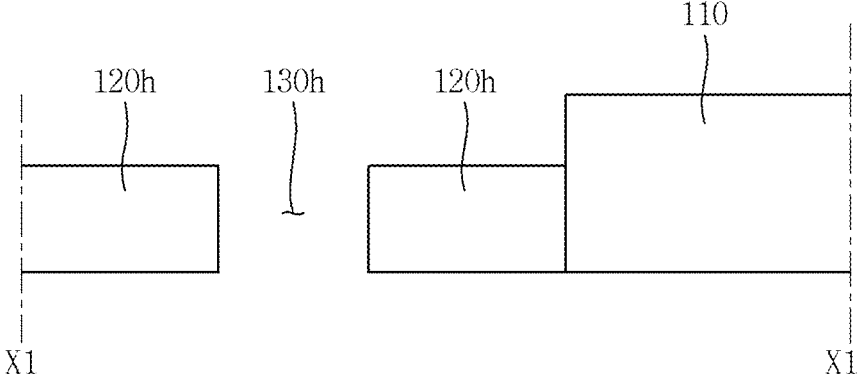
FIG. 30 is a schematic cross-sectional view, taken along line X1-X1' of FIG. 6, of a first magnet extension and a penetration hole according to another embodiment of the disclosure.

FIGS. 24 through 29 are schematic cross-sectional views, taken along line X-X' of FIG. 6, of first magnet extensions and penetration holes according to embodiments of the disclosure, and FIG. 30 is a schematic cross-sectional view, taken along line X1-X1' of FIG. 6, of a first magnet extension and a penetration hole according to another embodiment of the disclosure.

The configurations of FIGS. 24 through 29 may be the same as the configuration of FIG. 4 except for the cross-sectional shape of each penetration hole, and the configuration of FIG. 30 may be the same as the configuration of FIG. 4 except for the height of each first magnet extension.

Figure 24:
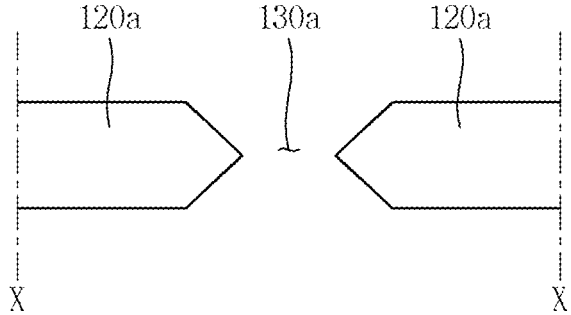
FIGS. 24 through 29 are schematic cross-sectional views, taken along line X-X' of FIG. 6, of first magnet extensions and penetration holes according to embodiments of the disclosure.

FIG. 24 schematically illustrates a first magnet extension and a penetration hole according to another embodiment of the disclosure.

Referring to FIG. 24, a penetration hole 130a may have a cross-sectional shape formed by combining a pair of trapezoids, and a first magnet extension 120a may have a pointed triangular cross-sectional shape in the penetration hole 130a. However, the disclosure is not limited to this.

Figure 25:
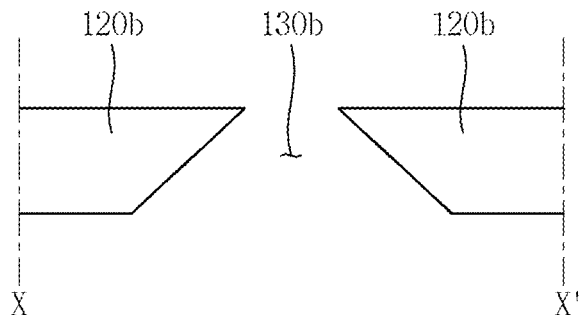

FIG. 25 schematically illustrates a first magnet extension and a penetration hole according to another embodiment of the disclosure.

Referring to FIG. 25, a penetration hole 130b may have an outwardly inclined shape in a top-to-bottom direction in a cross-sectional view, and a first magnet extension 120b may have a tapered surface in the penetration hole 130b in a cross-sectional view. However, the disclosure is not limited to this.

Figure 26:
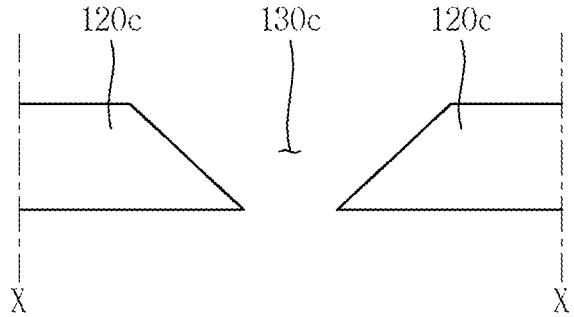

FIG. 26 schematically illustrates a first magnet extension and a penetration hole according to another embodiment of the disclosure.

Referring to FIG. 26, a penetration hole 130c may have an outwardly inclined shape in the opposite direction to the penetration hole 130b of FIG. 25, i.e., in a bottom-to-top direction, and a first magnet extension 120c may have a tapered surface in the opposite direction to its counterpart of FIG. 25 in the penetration hole 130c in a cross-sectional view.

Figure 27:
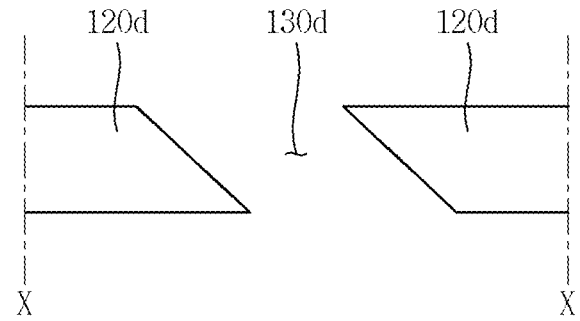

FIG. 27 schematically illustrates a first magnet extension and a penetration hole according to another embodiment of the disclosure.

Referring to FIG. 27, a penetration hole 130d of a first magnet extension 120d may have sides outwardly inclined in a same direction in a cross-sectional view. For example, the sides of the penetration hole 130d may both be outwardly inclined to the left, as illustrated in FIG. 27, or to the right.

FIG. 28 schematically illustrates a first magnet extension and a penetration hole according to another embodiment of the disclosure.

Referring to FIG. 28, the inner wall surface of a first magnet extension 120e forming a penetration hole 130e may have a triangular zigzag shape or a wavy shape with curves in a cross-sectional view, but the disclosure is not limited thereto.

FIG. 29 schematically illustrates a first magnet extension and a penetration hole according to another embodiment of the disclosure.

Referring to FIG. 29, a penetration hole 130f may have an elongated elliptical cross-sectional shape, but the disclosure is not limited thereto. In another embodiment, the penetration hole 130f may have a circular cross-sectional shape, and the inner wall surface of a first magnet extension 120f may have a concave groove shape that is recessed inwardly.

FIG. 30 schematically illustrates a first magnet extension and a penetration hole according to another embodiment of the disclosure.

Referring to FIG. 30, the thickness of a first magnet extension 120h with a rectangular penetration hole 130h may be smaller than the thickness of a first magnet main body 110. Thus, the thickness of the first magnet extension 120h may be reduced to form a step with the first magnet main body 110, but the disclosure is not limited thereto.

Thus, by thinning first magnet extensions 120 or providing penetration holes 130 of various shapes, the magnetic area of the first magnet extensions 120 may be reduced, and the magnetic field strength of first magnet members 100 and second magnet members 200 may be reduced accordingly.

The deposition apparatuses according to the aforementioned embodiments of the disclosure may be used in the manufacturing process of a display panel. A display panel according to an embodiment is illustrated in FIG. 31.

Figure 31:
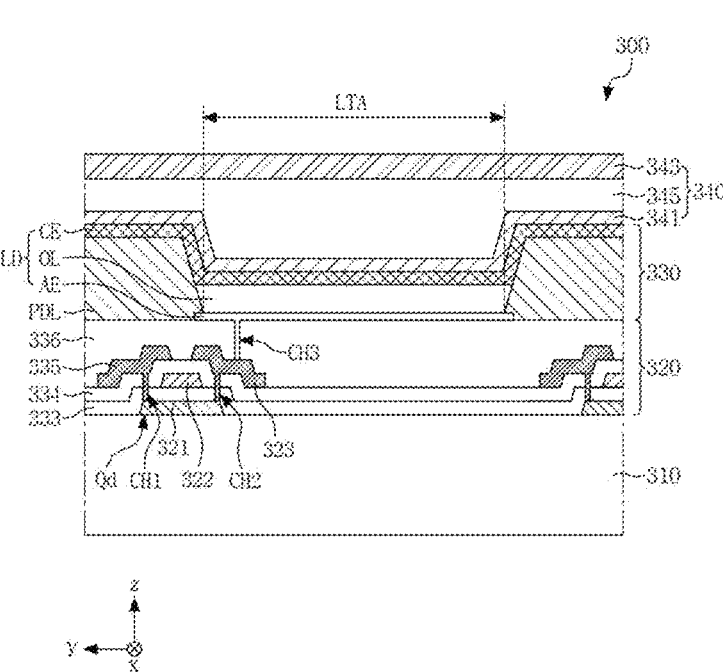
FIG. 31 is a schematic cross-sectional view illustrating a display panel according to an embodiment of the disclosure.

FIG. 31 is a schematic cross-sectional view illustrating a display panel according to an embodiment of the disclosure.

Referring to FIG. 31, a display panel 300 may include a base substrate 310, a driving layer 320, a light-emitting element layer 330, and an encapsulation layer 340.

The base substrate 310 may provide space for the driving layer 320, the light-emitting element layer 330, and the encapsulation layer 340. The base substrate 310 may be a flexible substrate and may be formed of a flexible polymer material. For example, the base substrate 310 may be formed of a flexible plastic material such as polyimide, polyethylene terephthalate, polyethylene naphthalate, polycarbonate, polyaryl ester, polyetherimide, or polyether sulfone. In another embodiment, the base substrate 310 may be a rigid substrate such as a glass substrate, a semiconductor substrate, or a quartz substrate.

The driving layer 320 may include components for providing signals to the light-emitting element layer 330. The driving layer 320 may include various signal lines (not illustrated), such as scan lines, data lines, power lines, and emission lines. The driving layer 320 may include multiple transistors and multiple capacitors. The transistors may include switching transistors (not illustrated) and driving transistors Qd, which are provided for respective pixels (not illustrated).

The driving transistors Qd may include an active layer 321, a gate electrode 322, a source electrode 335, and a drain electrode 323.

The driving layer 320 may further include a first insulating film 333, which is disposed on the active layer 321, and the gate electrode 322 may be positioned on the first insulating film 333.

The driving layer 320 may further include a second insulating film 334, which is positioned on the gate electrodes 322, and the source electrode 335 and the drain electrode 323 may be disposed on the second insulating film 334.

The source electrode 335 may be connected to the active layer 321 through contact holes CH1, which are formed in the first insulating film 333, and the drain electrode 323 may be connected to the active layer 321 through contact holes CH2, which are provided in the second insulating film 334. The source electrode 335 and the drain electrode 323 may be formed as metal multilayer structures (e.g., titanium/aluminum/titanium (Ti/Al/Ti)), but the disclosure is not limited thereto.

The driving layer 320 may further include a protective film 336, which is disposed on the source electrode 335 and the drain electrode 323.

The light-emitting element layer 330 may include light-emitting element LD, and the light-emitting element LD may include first electrode AE, an organic layer OL, and a second electrode CE.

The first electrode AE may be disposed on the protective film 336. The first electrode AE may be connected to the drain electrode 323 through contact hole CH3, which is formed in the protective film 336.

The light-emitting element layer 330 may further include a pixel-defining layer PDL, which is disposed on the protective film 336. The pixel-defining layer PDL may include an opening, which exposes the first electrode AE, and may define light-emitting area LTA.

The encapsulation layer 340 may be disposed on the light-emitting element layer 330. The encapsulation layer 340 may block moisture and oxygen from outside the light-emitting element layer 330.

The encapsulation layer 340 may be a thin film encapsulation layer and may include one or more organic films and one or more inorganic films. For example, the encapsulation layer 340 may include a first inorganic film 341, which is positioned on the second electrode CE, an organic film 345, which is positioned on the first inorganic film 341, and a second inorganic film 343, which is positioned on the organic film 345.

During the manufacture of the display panel 300, at least one of the deposition processes of metal materials for forming various electrodes may be performed using the aforementioned deposition apparatus 1. For example, the deposition process for forming the gate lines or the gate electrodes 322, the deposition process for forming the data lines or data electrodes, and/or the deposition process for forming the first electrode AE may be performed using the deposition apparatus 1. As previously mentioned, the deposition apparatus 1 may perform a stable deposition process by preventing excessive consumption of particular areas of the deposition target 50. Therefore, the display panel 300 may be stably manufactured. Moreover, uniform deposition quality may be ensured, and deposition efficiency may be improved, even with repeated manufacturing of multiple display panels 300.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A deposition apparatus comprising:
a chamber including an internal space where a deposition process takes place; and
at least one magnet unit positioned below the chamber and including a first magnet member and a second magnet member, the second magnet member being positioned around an outer periphery of the first magnet member and spaced apart from the first magnet member,
wherein
the first magnet member includes a first magnet main body, which extends in a first direction, and a first magnet extension, which is positioned at least one end of the first magnet main body and has a width greater than a width of the first magnet main body in a second direction intersecting the first direction,
the first magnet extension includes a penetration hole, and
a width, in the second direction, of the penetration hole is smaller than the width, in the second direction, of the first magnet main body.

2. The deposition apparatus of claim 1, wherein the penetration hole penetrates the first magnet extension in a third direction perpendicularly intersecting the first and second directions.

3. The deposition apparatus of claim 1, wherein the width, in the second direction, of the first magnet main body is about 1.1 to about 4.2 times the width, in the second direction, of the penetration hole.

4. The deposition apparatus of claim 1, wherein
the first magnet extension includes a first portion, which is positioned on a side, in the second direction, of the penetration hole, and a second portion, which is positioned on another side, in the second direction, of the penetration hole, and a width of the first portion and a width of the second portion, in the second direction, are each smaller than the width, in the second direction, of the first magnet main body.

5. The deposition apparatus of claim 4, wherein a sum of the width of the first portion and the width of the second portion, in the second direction, both lying on a virtual straight line extending along the second direction, is greater than the width, in the second direction, of the first magnet main body.

6. The deposition apparatus of claim 1, wherein the width, in the second direction, of the first magnet extension is greater than a width, in the first direction, of the first magnet extension.

7. The deposition apparatus of claim 6, wherein the width, in the second direction, of the first magnet extension is about 1.5 to about 2.9 times the width, in the second direction, of the first magnet main body.

8. The deposition apparatus of claim 1, wherein the second magnet member includes a second magnet main body, which is arranged in parallel to the first magnet main body, and second magnet end portions, which are positioned at both ends of the second magnet main body and face the first magnet extension, a width, in the second direction, of the second magnet main body is smaller than the width, in the second direction, of the first magnet main body, and the second magnet end portions include an inclined portion, which is inclined with respect to the first direction.

9. The deposition apparatus of claim 1, wherein the width of the first magnet main body in the second direction is about 19 mm to 29 mm, the width of the first magnet extension in the second direction is in a range of about 45 mm to about 55 mm, and a width of the first magnet extension in the first direction is in a range of about 25 mm to about 35 mm.

10. The deposition apparatus of claim 1, wherein the first magnet extension has a polygonal, circular, or elliptical planar shape in a plan view.

11. The deposition apparatus of claim 1, wherein a width-the width of the penetration hole in the second direction is in a range of about 7 mm to about 17 mm.

12. The deposition apparatus of claim 1, wherein the penetration hole has a triangular, rectangular, square, circular, or elliptical planar shape in a plan view.

13. The deposition apparatus of claim 1, wherein the second magnet member includes a second magnet main body, which is arranged in parallel to the first magnet main body, and a width, in the second direction, of the second magnet main body is smaller than the width, in the second direction, of the first magnet main body and is in a range of about 12 mm to about 22 mm.

14. The deposition apparatus of claim 1, wherein the second magnet member includes:

a second magnet main body, which is arranged in parallel to the first magnet main body and spaced apart from the first magnet main body with a first gap in the second direction; and second magnet end portions, which are positioned at both ends of the second magnet main body, face the first magnet extension, and spaced apart from the first magnet extension with a second gap in the first direction, a width, in the second direction, of the first gap is in a range of about 25 mm to about 35 mm, and a width, in the first direction, of the second gap is in a range of about 12 mm to about 22 mm.

15. The deposition apparatus of claim 1, further comprising:

a substrate fixing unit supporting a substrate in the chamber; and a deposition target disposed to face the substrate, wherein the at least one magnet unit is positioned below the deposition target.

16. A deposition apparatus comprising:

a chamber having a deposition target disposed in an internal space of the chamber; and a plurality of magnet units positioned below the deposition target, each of the plurality of magnet units including a first magnet member, which extends in a first direction, and a second magnet member, which is spaced apart from the first magnet member and completely surrounds the first magnet member, wherein the plurality of magnet units are spaced apart from one another in a second direction intersecting the first direction, the first magnet member of each of the plurality of magnet units includes penetration holes at both ends of the first magnet member in the first direction, and a width, in the second direction, of the penetration holes is smaller than a width, in the second direction, of a main body of the first magnet member.

17. The deposition apparatus of claim 16, wherein end portions of each of the plurality of magnet units are aligned on a virtual straight line extending in the second direction.

18. The deposition apparatus of claim 16, wherein a central area of the first magnet member in the first direction has a width in the second direction smaller than a width in the second direction of each of end portions of the first magnet member in the first direction.

19. The deposition apparatus of claim 16, wherein the second magnet member has a hollow closed-loop shape in a plan view, and the first magnet member is positioned inside the hollow closed-loop shape of the second magnet member.

* * * * *